US010614995B2

(12) United States Patent
Kelly et al.

(10) Patent No.: US 10,614,995 B2
(45) Date of Patent: Apr. 7, 2020

(54) ATOM PROBE WITH VACUUM DIFFERENTIAL

(71) Applicant: CAMECA Instruments Inc., Fitchburg, WI (US)

(72) Inventors: Thomas F. Kelly, Madison, WI (US); Mark Ronald Levesque, Fitchburg, WI (US)

(73) Assignee: Cameca Instruments, Inc., Madison, WI (US)

( * ) Notice: Subject to any disclaimer, the term of this patent is extended or adjusted under 35 U.S.C. 154(b) by 0 days.

(21) Appl. No.: 15/634,471

(22) Filed: Jun. 27, 2017

(65) Prior Publication Data

US 2017/0372868 A1    Dec. 28, 2017

Related U.S. Application Data

(60) Provisional application No. 62/355,003, filed on Jun. 27, 2016.

(51) Int. Cl.
 *H01J 37/18* (2006.01)
 *H01J 37/285* (2006.01)
 *H01J 37/16* (2006.01)

(52) U.S. Cl.
 CPC .............. *H01J 37/18* (2013.01); *H01J 37/16* (2013.01); *H01J 37/285* (2013.01); *H01J 2237/188* (2013.01); *H01J 2237/244* (2013.01); *H01J 2237/2852* (2013.01)

(58) Field of Classification Search
 CPC .. H01J 37/00; H01J 37/02; H01J 37/16; H01J 37/165; H01J 37/18; H01J 37/20; H01J 37/26

USPC ................. 250/306, 307, 309, 311
 See application file for complete search history.

(56) References Cited

U.S. PATENT DOCUMENTS

| | | | |
|---|---|---|---|
| 5,061,850 A | 10/1991 | Kelly et al. | |
| 5,440,124 A | 8/1995 | Kelly et al. | |
| 5,493,125 A * | 2/1996 | Okayama | H01J 37/18 250/441.11 |
| 6,576,900 B2 | 6/2003 | Kelly et al. | |
| 6,700,121 B1 | 3/2004 | Kelly et al. | |
| 7,157,702 B2 | 1/2007 | Gribb | |
| 7,652,269 B2 | 1/2010 | Bunton et al. | |
| 7,683,318 B2 | 3/2010 | Bunton et al. | |
| 7,772,552 B2 | 8/2010 | Gribb et al. | |

(Continued)

*Primary Examiner* — Jason L McCormack
(74) *Attorney, Agent, or Firm* — Craig A. Fieschko, Esq.; DeWitt LLP

(57) ABSTRACT

In an atom probe having a vacuum chamber containing a specimen mount and a detector for receiving ions emitted from the specimen, a high vacuum subchamber is provided about the specimen mount, with an aperture in the subchamber allowing passage of emitted ions to the detector. The high vacuum subchamber may be pumped to higher vacuum (lower pressure) than the vacuum chamber, and so long as the pressure in the vacuum chamber is below about $10^{-1}$ Pa, very little gas diffusion takes place through the aperture, allowing higher vacuum to be maintained in the subchamber despite the aperture opening to the chamber. The higher vacuum in the subchamber about the specimen assists in reducing noise in atom probe image data. The aperture may conveniently be provided by the aperture in a counter electrode, such as a local electrode, as commonly used in atom probes.

19 Claims, 1 Drawing Sheet

(56) References Cited

U.S. PATENT DOCUMENTS

| | | |
|---|---|---|
| 7,884,323 B2 | 2/2011 | Kelly et al. |
| 8,074,292 B2 | 12/2011 | Bostel et al. |
| 8,153,968 B2 | 4/2012 | Bunton et al. |
| 8,247,766 B2 | 8/2012 | Deconihout et al. |
| 8,276,210 B2 | 9/2012 | Vurpillot et al. |
| 8,502,139 B2 | 8/2013 | Yavor |
| 8,513,597 B2 | 8/2013 | Panayi |
| 8,575,544 B1 | 11/2013 | Kelly et al. |
| 8,670,608 B2 | 3/2014 | Kelly |
| 2004/0173747 A1* | 9/2004 | Dean ................ H01J 37/28 250/310 |
| 2009/0121132 A1* | 5/2009 | Koops ............... H01J 37/3056 250/307 |
| 2009/0242763 A1* | 10/2009 | Buijsse ............. H01J 37/023 250/307 |
| 2015/0213999 A1* | 7/2015 | Ominami .......... H01J 37/16 250/310 |
| 2016/0020064 A1* | 1/2016 | Laue ................. H01J 37/12 250/441.11 |

* cited by examiner

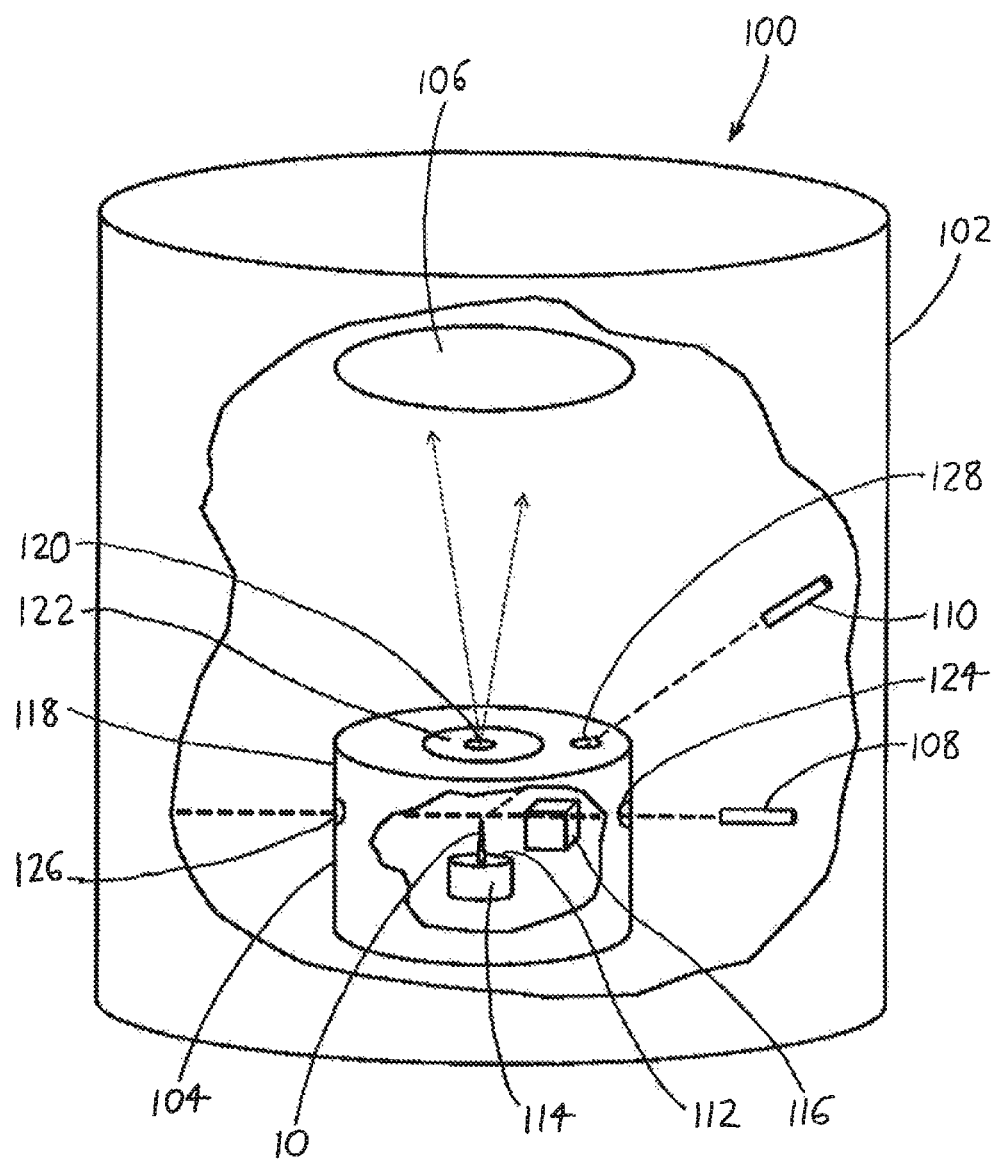

ATOM PROBE WITH VACUUM DIFFERENTIAL

CROSS-REFERENCE TO RELATED APPLICATIONS

This application claims priority under 35 USC § 119(e) to U.S. Provisional Patent Application 62/355,003 filed 27 Jun. 2016, the entirety of which is incorporated by reference herein.

FIELD OF THE INVENTION

This document concerns an invention relating generally to atom probes, and more specifically to atom probe vacuum quality.

BACKGROUND OF THE INVENTION

An atom probe, also referred to as an atom probe microscope, is a device which allows specimens to be analyzed on an atomic level. A typical atom probe includes a vacuum chamber containing a specimen mount, a detector opposite the specimen mount, and a counter electrode between the specimen mount and the detector. (The counter electrode is sometimes referred to as a "local electrode" or "extraction electrode"; additionally, because electrodes in an atom probe typically serve as electrostatic lenses, the term "lens" is sometimes used in place of the term "electrode.") During typical analysis, a specimen is situated in the specimen mount when the chamber is under high vacuum, with the specimen being cryogenically cooled to better "settle" its atoms and minimize their thermal motion. A positive electrical charge (e.g., a baseline voltage) is applied to the specimen such that the electrostatic field near the apex of the specimen—the portion of the specimen facing the detector—is near that required to spontaneously ionize atoms on the surface of the apex. The detector and counter electrode are each either grounded or negatively charged. A positive electrical pulse (above the baseline voltage), a laser pulse (e.g., photonic energy), and/or another pulsed form of ionization energy (e.g., an electron beam or packet, ion beam, RF pulse, etc.) is intermittently applied to the specimen to increase the probability that surface atoms on the specimen will ionize. Alternatively or additionally, a negative voltage pulse can be applied to the counter electrode in synchrony with the foregoing energy pulse(s). Occasionally, a pulse will cause ionization of a single atom from the apex of the specimen. The ionized atom(s) separate or "evaporate" from the apex, pass through an aperture in the counter electrode, and impact the surface of the detector, typically a microchannel plate (MCP). The elemental identity of an ionized atom can be determined by measuring its time of flight (TOF), that is, the time between the pulse that liberates the ion from the specimen apex and the time it impinges on the detector. The velocity of an ionized atom (and thus its TOF) varies based on the mass-to-charge-state ratio (m/n) of the atom/ion, with lighter and/or more highly charged ions taking less time to reach the detector. Since the TOF of an ion is indicative of the mass-to-charge ratio of the ion, which is in turn indicative of elemental identity, the TOF can help identify the composition of the ionized atom. In addition, the location of the ionized atom on the surface of the specimen can be determined by measuring the location of the atom's impact on the detector. Thus, as the specimen is evaporated, a three-dimensional map or image of the specimen's constituent atoms can be constructed. While the image represented by the map is a point projection, with atomic resolution and a magnification of over 1 million times, the map/image data can be analyzed in virtually any orientation, and thus the image can be considered tomographic in nature. Further details on atom probes can be found, for example, in U.S. Pat. Nos. 5,440,124; 7,157,702; 7,683,318; 7,884,323; 8,074,292; 8,276,210; 8,513,597; and 8,575,544, as well as in the patents and other literature noted on the first page of this document (and the patents and other literature referenced therein).

High vacuum is needed in the vacuum chamber because gases, water, and other contaminants present in the vacuum chamber can significantly degrade image quality. Such contaminants can impinge on the detector and mistakenly be interpreted as ions, and can interfere with ion flight. Even with high vacuum, "tramp gas"—that is, the small amount of residual contaminants left in the vacuum chamber after evacuation—creates noise in the image data, primarily from adsorption of such contaminants on the cryogenically-cooled specimen, with subsequent ionization of these contaminants then being detected as if they were components of the specimen. The vacuum chamber is therefore typically evacuated to ultra-high vacuum (UHV) conditions (chamber pressure below about $10^{-8}$ Pa), first by using conventional vacuum pumps to achieve medium/high vacuum (chamber pressure below about $10^{-3}$ Pa), and then by utilizing high vacuum pumps such as ion pumps (which ionize and electrically collect gases), cryopumps (which condense gases onto cold surfaces), getters and getter/sublimation pumps (which use materials which bond to or adsorb gases), and/or turbomolecular pumps (which mechanically propel gases from the vacuum chamber). The higher the vacuum—that is, the fewer stray molecules/atoms present in the vacuum chamber—the better the imaging results. However, achieving high vacuum is time-consuming, and has a significant impact on atom probe operating expense.

BRIEF DESCRIPTION OF THE DRAWING

The accompanying FIGURE presents a highly simplified schematic view of an atom probe 100 having a specimen mount 112 bearing a specimen 10, a counter electrode 122 defined as a part of a wall 118 of a high vacuum subchamber 104 surrounding the specimen 10, and a vacuum chamber 102 situated about the high vacuum subchamber 104, and also about a detector 106 for receiving ions from the specimen 10.

DESCRIPTION OF EXEMPLARY VERSIONS OF THE INVENTION

The invention, which is defined by the claims set forth at the end of this document, is directed to atom probe arrangements and methods which at least partially alleviate the time and expense of achieving suitable vacuum conditions. An exemplary version of the invention is then depicted in the accompanying drawing, wherein an atom probe 100 includes a vacuum chamber 102, which is shown partially cut away to reveal a high vacuum subchamber 104, a detector 106, and energy beam sources 108 and 110. The high vacuum subchamber 104 is also shown partially cut away to show a specimen mount 112 bearing a specimen 10 to be ionized, with the specimen mount 112 bearing a cooler 114 for cooling the specimen 10, and a high vacuum pump 116.

A subchamber wall 118 of the high vacuum subchamber 104 has an aperture 120 defined therein which provides a passage between the high vacuum subchamber 104 and the vacuum chamber 102. Here the aperture 120 is shown as the aperture of a counter electrode 122, e.g., a local electrode, which assists in ionizing atoms from the apex of the specimen 10. Such ionized atoms are schematically illustrated as dashed arrows directed toward the detector 106, which captures data regarding ion position and each ion's time of flight from the specimen 10.

During operation of the atom probe 100, the high vacuum subchamber 104 is preferably pumped by the high vacuum pump 116 until ultra-high vacuum (UHV) conditions are achieved (subchamber pressure below about $10^{-8}$ Pa), while the vacuum chamber 102 outside the high vacuum subchamber 104 can merely be operated at high vacuum (chamber pressure below about $10^{-3}$ Pa). (The vacuum pump(s) used to pump the vacuum chamber 102 to high vacuum are not shown.) Because the vacuum in the vacuum chamber 102 is sufficiently high that any gases or other free contaminants therein experience free molecular flow rather than viscous flow—that is, the contaminant particles are so sparse that they no longer collide with each other to rapidly spread in all directions, and instead they effectively travel in straight lines and only collide with surfaces of (and within) the vacuum chamber 102—contaminant diffusion through the aperture 120 is slow, and the high vacuum subchamber 104 will remain at UHV conditions for an extended period of time (or indefinitely, so long as the high vacuum pump 116 is operated continuously or at least periodically).

The depicted arrangement arose from the realization that atom probe image degradation from contaminants primarily arises from contaminants in the immediate vicinity of the specimen 10. In contrast, the atom probe's detector 106 is not as sensitive to contaminants, and image quality does not significantly increase as pressure is further decreased below about $10^{-3}$ Pa in regions of the chamber about the detector 106. Thus, the illustrated arrangement can yield effectively the same image quality as if the vacuum subchamber 104 was not present (save for the counter electrode 122, which is used for ionization), and if the entire vacuum chamber 102 was evacuated to UHV. However, the illustrated arrangement can be readied for atom probe imaging much more quickly than where the entire vacuum chamber 102 is evacuated to UHV, as only the (preferably smaller) high vacuum subchamber 104 need be pumped to UHV conditions.

Additionally, since the high vacuum subchamber 104 can provide a degree of insulation for the cooler 114, the thermal environment of the specimen 10 can be more easily controlled, and cooling of the specimen 10 can be expedited. The cooler 114, or more preferably a separate cooler within the high vacuum subchamber 104, can also act as a cryopump to condense and collect contaminants within the subchamber 104. In particular, maintaining a cryopump within the smaller high vacuum subchamber 104 can make it easier to attain temperatures near the specimen 10 which are at and below the condensation temperature of hydrogen (23K), a notoriously pervasive contaminant, and can thereby reduce hydrogen-generated noise.

To review the illustrated arrangement further, the counter electrode 122 (if present) need not be provided on the subchamber wall 118, and can be provided within the high vacuum subchamber 104. In this case, the high vacuum subchamber 104 may have a separate aperture 120 in line with the specimen 10, counter electrode 122, and detector 106. However, such an aperture will typically need to be larger than any aperture provided in a counter electrode 122 in order to avoid interference with released ions, and can therefore have a greater tendency to admit contaminants into the high vacuum subchamber 104 from the vacuum chamber 102. The aperture between the vacuum chamber 102 and high vacuum subchamber 104 is preferably as small as possible to deter contaminant entry; ideally, if one were to imagine an envelope completely bounding the interior of the high vacuum subchamber 104, the walls of the subchamber 104 would preferably define at least 99% of the surface area of this envelope, with the aperture occupying no more than 1% of the envelope's surface area.

While the high vacuum subchamber 104 is depicted as being entirely situated within the vacuum chamber 102, it need not be; for example, the high vacuum subchamber 104 could rest entirely outside the vacuum chamber 102, and the vacuum chambers 102 and 104 could merely share a common wall in which the aperture 120 is provided. The high vacuum subchamber 104 could instead rest only partially within the vacuum chamber 102, with a portion of the high vacuum subchamber 104 resting outside the vacuum chamber 102.

The atom probe 100 is also depicted with energy beam sources 108 and 110, for example, laser or electron beam sources to assist with imaging (e.g., positioning, monitoring, and/or illumination) and/or ionization of the specimen 10, or ion beam sources to assist with preparation (shaping/milling) of the specimen 10 prior to ionization. Assuming the beam source 108 is an ion beam, the high vacuum subchamber 104 requires a beam entry aperture 124 for receiving the beam, and possibly a beam exit aperture 126 allowing the beam to exit the high vacuum subchamber 104. Again, so long as the vacuum chamber 102 is within the molecular flow regime and any such apertures 124 and 126 are small, UHV can be easily maintained in the high vacuum subchamber 104. Assuming the beam source 110 is a laser, the high vacuum subchamber 104 may include a beam aperture 128 defined as an empty passageway, or the beam aperture 128 may have a solid transmissive window situated therein. Similarly, if the beam source 110 is an electron gun, the beam aperture 128 may either be empty, or may include a solid transmissive window such as a silicon nitride film.

It should be understood that the illustrated atom probe configuration is merely a highly simplified exemplary configuration, and the invention may be implemented in atom probes having significantly different configurations. The drawing does not include positioning stages for aligning the specimen 10 and/or counter electrode 22, ports and/or seals for the vacuum chambers 102 and 104, and certain other conventional components, though any such components may be present when the invention is implemented. Regarding seals, molecular flow is achieved in the vacuum chamber 102 when its pressure is lower than about $10^{-1}$ Pa. As a result, any seams or other potential leakage points in the high vacuum subchamber 104 which are exposed to the high vacuum subchamber 104 do not need typical UHV seals, and can simply operate with mating surfaces which keep gas conductance (i.e., maximum gas flow owing to pressure differentials) low.

It should also be understood that when it is stated that the invention relates to atom probe arrangements and methods, this is intended to encompass both atom probes and other instrumentation which incorporates atom probe capabilities. Examples of such "combined instruments" include transmission electron microscopes combined with atom probes (TEM-APT), scanning transmission electron microscopes combined with atom probes (STEM-APT), and focused ion beam instruments with atom probes (FIB-APT). The invention is particularly useful for performing atom probe tomography in systems that are not truly Ultra-High Vacuum (UHV) and/or are otherwise more prone to contaminants, such as where a high vacuum subchamber 104 uses polymeric O-ring seals and/or does not implement elevated temperature "baking" of the subchamber as a pre-imaging preparation step to expel adsorbed contaminants. Examples include lower-cost atom probe vacuum systems that are sealed with O-rings, and "combined instruments" that incorporate atom probe capabilities with other instruments that do not use UHV.

Throughout this document, where a measurement or other value is qualified by the term "about" (for example, "about $10^{-8}$ Pa"), this can be regarded as referring to a variation of 10% from the noted value. For example, "about 50K" can be understood to mean the range between and including 45 and 55 Kelvin.

It should be understood that the versions of the invention described above are merely exemplary, and the invention is not intended to be limited to these versions. Rather, the scope of rights to the invention is limited only by the claims set out below, and the invention encompasses all different versions that fall literally or equivalently within the scope of these claims.

What is claimed is:

1. An atom probe including:
   a. a specimen mount configured to bear a specimen to be ionized;
   b. a detector situated to receive ions from the specimen;
   c. a vacuum chamber enclosing the detector;
   d. a high vacuum subchamber wherein:
      (1) the detector is situated outside the high vacuum subchamber,
      (2) the specimen mount is within the high vacuum subchamber, and
      (3) the high vacuum subchamber is configured to provide:
         (a) vacuum below about $10^{-8}$ Pa, and
         (b) higher vacuum than any vacuum provided in the vacuum chamber.

2. The atom probe of claim 1 wherein the high vacuum subchamber is bounded by subchamber walls, the subchamber walls having an aperture defined therein, the aperture providing a passage between the high vacuum subchamber and the vacuum chamber.

3. The atom probe of claim 2 wherein the aperture is a counter electrode interposed between the specimen mount and the detector.

4. The atom probe of claim 2 wherein the subchamber walls within the high vacuum subchamber define at least 99% of the surface area of an envelope completely bounding the interior of the high vacuum subchamber.

5. The atom probe of claim 1 wherein the high vacuum subchamber is situated at least partially within the vacuum chamber.

6. The atom probe of claim 1 wherein the pressure in the high vacuum subchamber is at least 100 times lower than the pressure in the vacuum chamber.

7. The atom probe of claim 1:
   a. wherein the subchamber walls include a beam aperture defined therein, and
   b. further including an energy beam source aligned to emit an energy beam through the beam aperture.

8. An atom probe including:
   a. a vacuum chamber;
   b. a high vacuum subchamber including a specimen mount therein, wherein the high vacuum subchamber:
      (1) is bounded by subchamber walls, the subchamber walls having an aperture defined therein, the aperture providing a passage between the high vacuum subchamber and the vacuum chamber; and
      (2) is configured to provide:
         (a) vacuum below about $10^{-8}$ Pa, and
         (b) higher vacuum than any vacuum provided in the vacuum chamber.

9. The atom probe of claim 8 wherein the vacuum chamber includes a detector therein.

10. The atom probe of claim 9 wherein the aperture is a counter electrode situated along an axis between the specimen mount and the detector.

11. The atom probe of claim 8 wherein the subchamber walls define at least 99% of the surface area of an envelope completely bounding the interior of the high vacuum subchamber.

12. The atom probe of claim 8:
   a. wherein the subchamber walls include a window defined therein, and
   b. further including an energy beam source aligned to emit an energy beam through the window.

13. An atom probe including:
   a. a high vacuum subchamber:
      (1) bounded by subchamber walls, the subchamber walls having a counter electrode defined therein,
      (2) including a specimen mount therein, the specimen mount being configured to bear a specimen to be ionized; and
   b. a vacuum chamber:
      (1) situated outside the high vacuum subchamber, with the counter electrode defining a passage between the high vacuum subchamber and the vacuum chamber,
      (2) including a detector therein, the detector being situated to receive ions through the counter electrode from the specimen,
   wherein:
   i. the high vacuum subchamber contains vacuum below about $10^{-8}$ Pa, and
   ii. the pressure in the high vacuum subchamber is lower than the pressure in the vacuum chamber.

14. The atom probe of claim 13 wherein the high vacuum subchamber is situated at least partially within the vacuum chamber.

15. The atom probe of claim 13 wherein the subchamber walls within the high vacuum subchamber define at least 99% of the surface area of an envelope completely bounding the interior of the high vacuum subchamber.

16. The atom probe of claim 13:
   a. wherein the subchamber walls include a window defined therein, and
   b. further including an energy beam source aligned to emit an energy beam through the window.

17. The atom probe of claim 8 wherein the high vacuum subchamber is situated at least partially within the vacuum chamber.

18. The atom probe of claim 8 wherein the vacuum chamber is situated outside the high vacuum subchamber.

19. The atom probe of claim 1 wherein the vacuum chamber is situated outside the high vacuum subchamber.

* * * * *